(12) United States Patent
Morimoto et al.

(10) Patent No.: US 8,003,438 B2
(45) Date of Patent: Aug. 23, 2011

(54) CIRCUIT MODULE AND MANUFACTURING METHOD THEREOF

(75) Inventors: Kenji Morimoto, Ehime (JP);
Shigetoshi Segawa, Ehime (JP)

(73) Assignee: Panasonic Corporation, Tokyo (JP)

( * ) Notice: Subject to any disclaimer, the term of this patent is extended or adjusted under 35 U.S.C. 154(b) by 942 days.

(21) Appl. No.: 11/905,870

(22) Filed: Oct. 5, 2007

(65) Prior Publication Data

US 2008/0090335 A1 Apr. 17, 2008

Related U.S. Application Data

(62) Division of application No. 10/895,050, filed on Jul. 21, 2004, now abandoned.

(30) Foreign Application Priority Data

Jul. 22, 2003 (JP) ................................ 2003-277432

(51) Int. Cl.
*H01L 23/48* (2006.01)
*H01L 23/12* (2006.01)

(52) U.S. Cl. ........ 438/107; 438/118; 438/125; 438/329; 257/700; 257/703; 257/758; 257/778; 257/E21.511; 257/E21.512; 257/E23.062; 257/E23.178; 257/E25.023; 361/795; 174/256; 174/260

(58) Field of Classification Search .................. 438/107, 438/118, 125, 329; 257/700, 703, 758, 778, 257/E21.511, E21.512, E23.062, E23.178, 257/E25.023; 361/795; 174/256, 260
See application file for complete search history.

(56) References Cited

U.S. PATENT DOCUMENTS

| 5,079,065 | A | 1/1992 | Masakazu et al. |
| 5,672,226 | A | 9/1997 | Deardorf |
| 5,745,984 | A | 5/1998 | Cole et al. |
| 6,207,259 | B1 | 3/2001 | Iino et al. |
| 6,538,210 | B2 | 3/2003 | Sugaya et al. ............ 174/258 |
| 6,583,210 | B2 | 6/2003 | Zanzig et al. |
| 6,876,554 | B1 * | 4/2005 | Inagaki et al. ............ 361/763 |
| 2003/0071350 | A1 | 4/2003 | Takehara et al. |

FOREIGN PATENT DOCUMENTS

| EP | 1 267 596 A | 12/2002 |
| JP | 63 002336 A | 1/1988 |
| JP | 09-148743 | 6/1997 |
| JP | 10-256413 | 9/1998 |
| JP | 10-261872 | 9/1998 |
| JP | 11 054646 A | 2/1999 |
| JP | 11 054647 A | 2/1999 |
| JP | 2000-260902 | 9/2000 |
| JP | 2002-374067 | 12/2002 |
| JP | 2003-100937 | 4/2003 |
| JP | 2003-14268 | 5/2003 |
| JP | 2003-142628 | * 5/2003 |

* cited by examiner

*Primary Examiner* — Dao H Nguyen
(74) *Attorney, Agent, or Firm* — Bacon & Thomas, PLLC

(57) ABSTRACT

A circuit module includes an electronic component, a ceramic multilayer substrate and a resin wiring substrate. The ceramic multilayer substrate is provided with a wiring layer disposed on top thereof and a cavity in which the electronic component is mounted, wherein a space between the electronic component and the cavity is filled with a thermosetting resin and a surface of the filled cavity is planarized. The resin wiring substrate has an insulating adhesive layer disposed at one side thereof and provided with at least one opening filled with a conductive resin. The ceramic multilayer substrate and the resin wiring substrate are bonded by the insulating adhesive layer, and the wiring layer on the ceramic multilayer substrate is electrically connected with the conductive resin.

9 Claims, 16 Drawing Sheets

CIRCUIT MODULE AND MANUFACTURING METHOD THEREOF

This application is a divisional application of pending U.S. application Ser. No. 10/895,050 filed Jul. 21, 2004.

FIELD OF THE INVENTION

The present invention relates to a high-performance circuit module having electronic components such as a semiconductor integrated circuit (hereinafter, refer to as an "IC") and a manufacturing method thereof.

BACKGROUND OF THE INVENTION

Along with a high density integration and a high speed performance of ICs, concerted efforts are being made to develop technologies to increase the number of terminals and to narrow the pitches of a package on which such an IC is mounted. With respect to this, a technological progress is underway to fabricate a circuit module, on which electronic devices such as an IC is mounted, that is larger in scale, faster in speed, and smaller in size. In order to achieve such a miniaturization and high density of a circuitry, it is required to increase the number of wiring layers, to miniaturize wirings, and to develop a technology to enable mounting of electronic components including an IC inside a circuit substrate. Further, with respect to a method of mounting an IC, a flip-chip technology, which allows for a high density mounting, has been widely available. As a circuit substrate appropriate for the purposes, a multilayer ceramic substrate, a multilayer resin substrate, or a combination thereof are being used.

With respect to a circuit substrate, a high-density mountability, high-speed performance and low costs are the characteristics that are strongly required. As a result, to satisfy these requirements, efforts are actively being made to develop a combined multilayer substrate composed of a ceramic multilayer substrate and a resin substrate. For example, Japanese Patent Laid-open Publication No. 2002-374067 discloses a circuit substrate composed of a ceramic multilayer substrate stacked and bonded, by pressurization and heating, with a resin base material formed of thermoplastic resin on which conductive wiring patterns are formed and via holes are disposed within its interlayer connective sections. In accordance with this configuration, the fabrication step of a multilayer substrate composed of a multilayer ceramic substrate and a resin base material becomes simplified. Further, given that a reliable bonding between a multilayer ceramic substrate and a resin base material can be achieved, a highly reliable circuit substrate can be obtained.

Further, Japanese Patent Laid-open Publication No. 1998-256413 discloses an IC package composed of a ceramic multilayer substrate, within which a cavity is formed where an IC is mounted, bonded on and combined with a resin base material having a conductive layer and an insulating ceramic layer. In accordance with this configuration, since a wiring length and distance can both be reduced given that a patterned conductive layer can be formed on a resin base material, it is possible to achieve a miniaturized IC package with a high density wiring therein.

As noted above, with respect to a circuit substrate, miniaturization, high-speed performance and high performance are the characteristics strongly required. However, according to the first prior art reference above, since a multilayer wiring is not formed on the ceramic multilayer substrate, the substrate only serves as a base material. Further, the disclosed technology only enables an IC to be surface mounted. Therefore, in accordance with the technology, a high performance complex circuit substrate cannot be achieved.

Further, in the second prior art reference above, a resin base material having a conductive layer is interposed between the ceramic multilayer substrates while the layers are bonded using an adhesive and an IC is mounted in the cavity. However, since the ceramic multilayer substrates disposed on opposed surfaces function as the main component, fine wiring patterns cannot be achieved. Further, the problem of high costs has remained to be solved given that double-surface wirings would be required for a ceramic multilayer substrate in order to mount additional electronic components on the surface opposed to a mounting surface, the mounting surface being connected to a circuit substrate by using conductive balls. In addition, in order to be compatible with a high-speed performance IC, for example, a bypass capacitor must be connected to an electrode terminal of the IC at a minimum distance. However, in the second prior art reference, since a bypass capacitor cannot be mounted on an upper portion of the cavity, the capacitor can only be mounted on an external circuit substrate. Consequently, it has remained to be solved that an extensive wiring distance prevented achieving a high-speed operation.

SUMMARY OF THE INVENTION

It is, therefore, an object of the present invention to provide a circuit module, which is capable of containing a cavity structure, with a higher-density mountability and high-speed performance to solve the problems identified thus far, and to provide a method of fabricating the module.

In accordance with a preferred embodiment of the present invention, there is provided a first circuit module including: an electronic component; a ceramic multilayer substrate provided with a wiring layer disposed on top thereof and a cavity in which the electronic component is mounted, wherein a space between the electronic component and the cavity is filled with a thermosetting resin and a surface of the filled cavity is planarized; and a resin wiring substrate including an insulating adhesive layer disposed at one side thereof and provided with at least one opening filled with a conductive resin, wherein the ceramic multilayer substrate and the resin wiring substrate are bonded by the insulating adhesive layer, and the wiring layer on the ceramic multilayer substrate is electrically connected with the conductive resin.

In accordance with this configuration, given that an electronic component including an IC is mounted within the ceramic multilayer substrate, and also that the resin wiring substrate encloses the cavity region, various electronic components can be mounted on the resin wiring substrate on the cavity. Specifically, an IC or a passive device can also be mounted on the resin wiring substrate, including the areas inside and on the cavity. As a result, a module, which is miniaturized and having a high mounting density, high-speed performance and little noise can be obtained, because a higher mounting density of electronic components and a minimum distance wiring thereof are enabled.

In accordance with another preferred embodiment of the present invention, there is provided a second circuit module, which includes the first circuit module, wherein the height difference between a surface of the thermosetting resin filling the cavity and that of the ceramic multilayer substrate around the cavity is less than a thickness of the insulating adhesive layer.

In accordance with this configuration, when resin wiring patterns are formed on the ceramic multilayer substrate, it is possible to obtain a flat planar shape so that obtaining a multilayer structure becomes easier.

In accordance with still another preferred embodiment of the present invention, there is provided a third circuit module, which includes the first circuit module, wherein the resin wiring substrate further includes one or more stacking sheets, each of the stacking sheets having an insulating adhesive layer, a wiring layer formed thereon, the insulating adhesive layer being provided with at least one opening filled with a conductive resin and electrically connected to the wiring layer of each of the stacking sheets.

In accordance with this configuration, since the multilayer resin wiring substrate can be formed of sheets of a same material, not only are the fabrication steps simplified, but high performance circuit modules can be obtained at a low cost as well.

In accordance with still another preferred embodiment of the present invention, there is provided a fourth circuit module, which includes the first circuit module, wherein the insulating adhesive layer makes use of a thermosetting material. As a result, since the chemical resistance is increased after bonding on the ceramic multilayer substrate following thermally curing the adhesive layer, forming a wiring layer by etching the metal layer becomes easy. Further, the sturdiness of the module is enhanced.

In accordance with still another preferred embodiment of the present invention, there is provided a fifth circuit module, which includes the first circuit module, wherein the ceramic multilayer substrate is made of a glass-ceramic material allowing a low temperature sintering. As a result, since the ceramic multilayer substrate can be co-sintered with the conductive and insulating layers, the sintering operation can be carried out at a low cost. Further, since the difference between the ceramic substrate's thermal expansion coefficient and that of the resin wiring substrate is small, the module can withstand heating impact so that it is prevented from peeling off. Therefore, a highly reliable circuit module can be obtained.

In accordance with still another preferred embodiment of the present invention, there is provided a sixth circuit module, which includes the first circuit module, wherein at least one electronic component is mounted on a surface of the resin wiring substrate, at least a part of said at least one electronic component being located directly above at least a part of the cavity formed in the ceramic multilayer substrate. As a result of this configuration, for instance, if an IC is mounted on the cavity, a bypass capacitor can be mounted in a minimum distance from the IC's terminal. Accordingly, a circuit module capable of high-speed performance can be easily obtained.

In accordance with still another preferred embodiment of the present invention, there is provided a first method of fabricating a circuit module, which includes the steps of: mounting at least one electronic component in a cavity provided in a ceramic multilayer substrate; filling a space between the electronic component and the cavity with a thermosetting resin to planarize a surface of the filled cavity; providing at least one opening in an insulating adhesive layer of a sheet having the insulating adhesive layer and a metal layer stacked on each other or in both of the insulating adhesive layer and the metal layer, and filling the opening with a conductive resin connected to the metal layer; bonding the sheet and the ceramic multilayer substrate by the insulating adhesive layer and at the same time electrically connecting a wiring layer formed on the ceramic multilayer substrate with the conductive resin; and patterning the metal layer of the sheet to form a wiring layer.

In accordance with this method, the resin wiring substrate can be easily stacked on a ceramic multilayer substrate, of which cavity contains an electronic component such as an IC, and which is planarized by a thermosetting resin. Especially, since a wiring pattern on the metal layer of the sheet can be formed by a process such as etching after the sheet is bonded to the ceramic multilayer substrate, it is difficult to misalign the wiring pattern with the top surface wiring layer of the ceramic multilayer substrate. Consequently, it is possible to form fine patterns, thereby obtaining a multilayer structure as well. Further, given that it is easy to fill the opening with a conductive resin, a conduction failure rarely occurs. Therefore, a highly reliable circuit module having a high density wiring layer can be obtained.

In accordance with still another preferred embodiment of the present invention, there is provided a second method, which includes the first method, and further includes the steps of: bonding a stacking sheet which has an insulating adhesive layer and a metal layer, at least one opening being provided in the insulating adhesive layer or in both of the insulating adhesive layer and the metal layer and filled with a conductive resin connected with the metal layer, by means of the insulating adhesive layer, onto an uppermost layer of an assembly provided in the immediately preceding step and at the same time electrically connecting the wiring layer formed on the uppermost layer with the conductive resin of the stacking sheet; and patterning the metal layer of the stacking sheet to form a wiring layer, wherein the above two steps are repeated N times (N being an integer not smaller than 1).

In accordance with this method, the multilayer resin wiring substrate can be easily formed on a ceramic multilayer substrate, of which cavity contains an electronic component such as an IC, and which is planarized by a thermosetting resin.

In accordance with still another preferred embodiment of the present invention, there is provided a third method of fabricating a circuit module, which includes the steps of: mounting at least one electronic component in a cavity provided in a ceramic multilayer substrate; filling a space between the electronic component and the cavity with a thermosetting resin to planarize a surface of the filled cavity; patterning a metal layer of a sheet to form a wiring layer, the sheet having an insulating adhesive layer and the metal layer stacked on each other; providing at least one opening in the insulating adhesive layer or in both of the insulating adhesive layer and the wiring layer, and filling the opening with a conductive resin connected to the wiring layer; and bonding the sheet and the ceramic multilayer substrate by means of the insulating adhesive layer and at the same time electrically connecting a wiring layer formed on the ceramic multilayer substrate with the conductive resin.

In accordance with this method, the resin wiring substrate can be easily stacked on a ceramic multilayer substrate, of which cavity contains an electronic component such as an IC, and which is planarized by a thermosetting resin. In this method, since before being bonded to the ceramic multilayer substrate, a wiring pattern is formed on the sheet's metal layer by a process such as etching, and at the same time, an opening is formed and is filled with a conductive resin, the processes of forming openings and wiring-patterns as well as charging with the conductive resin can be carried out collectively using a large sheet. Therefore, the fabrication steps are considerably simplified.

In accordance with still another preferred embodiment of the present invention, there is provided a fourth method, which includes the third method, and further includes the step of bonding a stacking sheet which has an insulating adhesive layer and a wiring layer, at least one opening being provided in the insulating adhesive layer or in both of the insulating adhesive layer and the wiring layer and filled with a conductive resin connected with the wiring layer, by means of the insulating adhesive layer, onto an uppermost layer of an assembly provided in the immediately preceding step and at the same time electrically connecting the wiring layer formed on the uppermost layer with the conductive resin of the stacking sheet, wherein the above step is repeated N times (N being an integer not smaller than 1).

In accordance with this method, the multilayer resin wiring substrate can be easily formed on a ceramic multilayer substrate, of which cavity contains an electronic component such as an IC, and which is planarized by a thermosetting resin.

In accordance with still another preferred embodiment of the present invention, there is provided a fifth method of fabricating a circuit module, which includes the steps of: mounting at least one electronic component in a cavity provided in a ceramic multilayer substrate; filling a space between the electronic component and the cavity with a thermosetting resin to planarize a surface of the filled cavity; patterning a metal layer of a sheet to form a wiring layer and simultaneously providing at least one opening in the wiring layer, the sheet having an insulating adhesive layer and the metal layer stacked on each other; bonding the sheet and the ceramic multilayer substrate by means of the insulating adhesive layer; removing the insulating adhesive layer located under the opening in the wiring layer to provide an extended opening exposing therethrough a surface of a wiring layer formed on the ceramic multilayer substrate; and filling the extended opening with a conductive resin to electrically connect the wiring layer of the sheet with the wiring layer on the ceramic multilayer substrate.

In accordance with this method, the resin wiring substrate can be easily stacked on a ceramic multilayer substrate, of which cavity contains an electronic component such as an IC, and which is planarized by a thermosetting resin. Further, in this method, since before being bonded to the ceramic multilayer substrate, a wiring pattern is formed on the sheet's metal layer by a process such as etching, and after being bonded to the ceramic multilayer substrate, openings are formed on the insulating adhesive layer and are filled with a conductive resin, the openings are not yet formed during bonding and handling during bonding becomes easy, even when multiple openings are formed.

In accordance with still another preferred embodiment of the present invention, there is provided a sixth method, which includes the fifth method, and further includes the steps of: bonding a stacking sheet which has an insulating adhesive layer and a wiring layer, at least one opening being provided in the wiring layer, onto an uppermost layer of an assembly provided in the immediately preceding step by means of the insulating adhesive layer; in the stacking sheet, removing the insulating adhesive layer located under the opening in the wiring layer to provide an extended opening exposing therethrough a surface of the uppermost layer; and filling the extended opening in the stacking sheet with a conductive resin and electrically connecting the wiring layer of the stacking sheet with a wiring layer of the uppermost layer, wherein the above steps are repeated N times (N being an integer not smaller than 1)

In accordance with this method, the resin wiring substrate can be easily stacked on a ceramic multilayer substrate, of which cavity contains an electronic component such as an IC, and which is planarized by a thermosetting resin.

In accordance with still another preferred embodiment of the present invention, there is provided a seventh method, which includes one of the first, third and fifth method, wherein an amount of the thermosetting resin used in said step of filling the space to planarize the surface of the filled cavity corresponds to the difference between a volume of the cavity and that of the electronic component, and the height difference between a surface of the thermosetting resin and that of the ceramic multilayer substrate around the cavity is less than a thickness of the insulating adhesive layer in the immediate vicinity of the ceramic multilayer substrate. Further preferably, there is provided an eighth method, which includes one of the first, third and fifth method, wherein the step of filling the space to planarize the surface of the filled cavity is carried out by first filling the cavity with the thermosetting resin by using an amount exceeding the difference between a volume of the cavity and that of the electronic component, thermally curing the filled thermosetting resin, and then polishing a surface of the cured thermosetting resin and wherein the height difference between a surface of the polished resin and that of the ceramic multilayer substrate around the cavity is less than a thickness of the insulating adhesive layer directly abutting the ceramic multilayer substrate.

In accordance with these methods, since the height difference between the cavity region and the surface of the ceramic multilayer substrate is less than the thickness of the insulating adhesive layer, when the resin wiring substrate is stacked on the ceramic multilayer substrate, the height difference can be covered up by the insulating adhesive layer, and thus it is possible to prevent unevenness on the resin wiring substrate after bonding. As a result, it is easy to form the resin wiring substrate with multilayers.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1A:
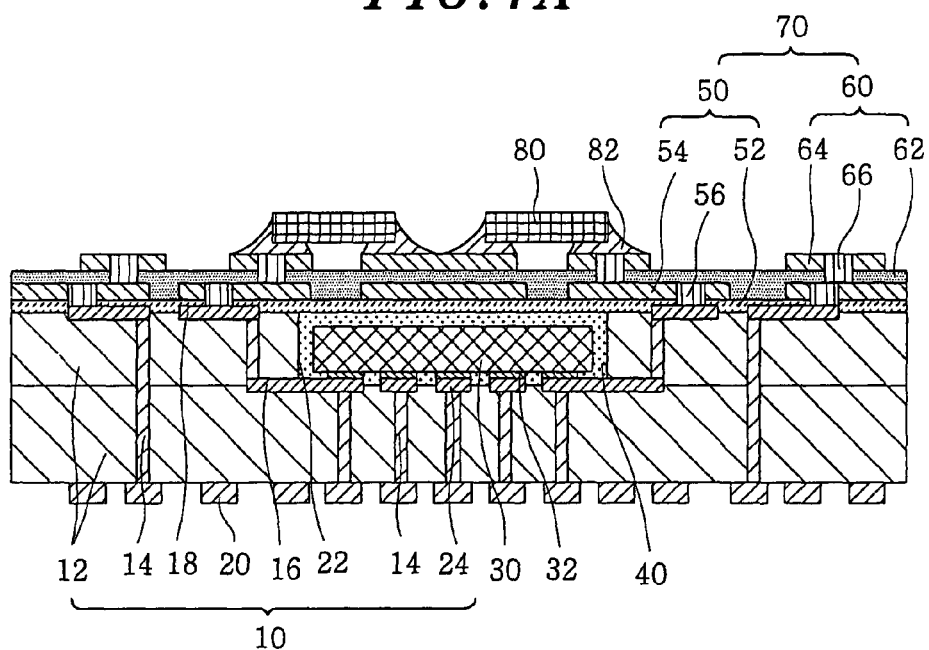
FIGS. 1A and 1B are a cross-sectional view and a top plan view, respectively, of a circuit module in accordance with the first embodiment of this invention.

Hereinafter, preferred embodiments of the present invention are described in detail with reference to the accompanying figures. Same items in the figures are assigned a common reference numeral throughout the figures.

First Embodiment

A circuit module and a method of manufacturing same, in accordance with a first embodiment of this invention, are described with reference to FIGS. 1A to 4B.

Figure 1B:
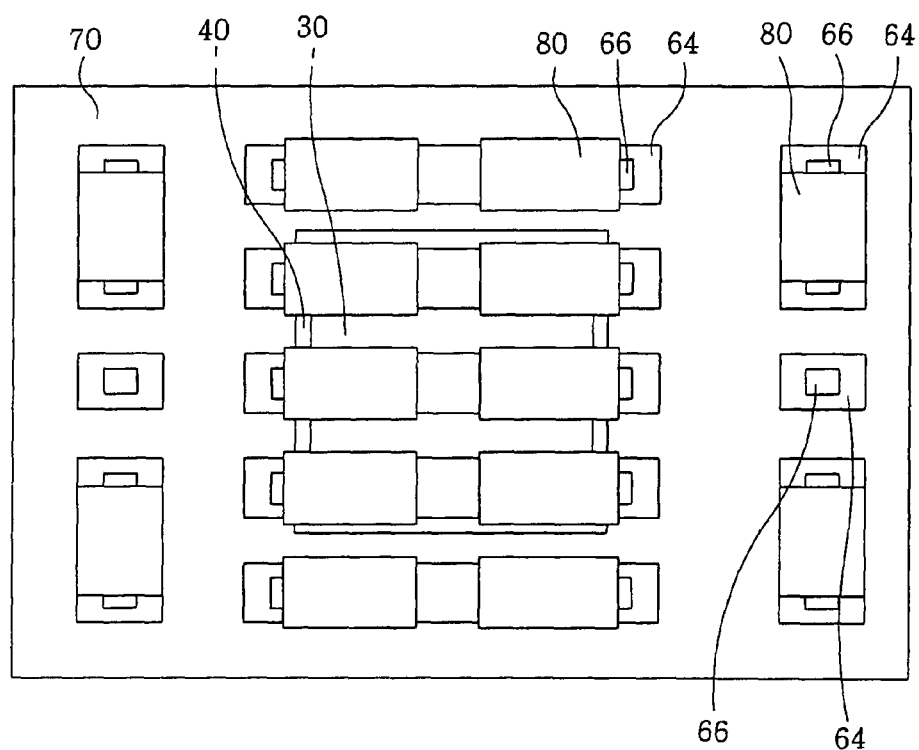

FIGS. 1A and 1B are a cross-sectional view and a top plan view, respectively, of a circuit module in accordance with this first embodiment.

Multilayer ceramic substrate 10 is provided with conductive via 14 formed in dielectric layer 12 to make electrical connection between layers; interior wiring layer 16, top surface wiring layer 18 and bottom surface wiring layer 20, all of which are electrically connected with conductive via 14; and cavity 22 for mounting electronic component 30 thereon. For such multilayer ceramic substrate 10, for instance, when a glass-ceramic material is used as dielectric layers 12, it can be sintered at a relatively low temperature in the range of about 900-1000° C. Consequently, dielectric layers 12 can be co-sintered with materials that form conductive via 14 and interior wiring layer 16. Further, it is possible to form top surface wiring layer 18, bottom surface wiring layer 20 and the like by co-sintering operation. However, top and bottom surface wirings 18 and 20 are typically excluded in the co-sintering of dielectric layers 12, conductive via 14 and interior wiring layer 16; instead, after forming wiring patterns on the top and bottom surfaces of dielectric layers 12, the substrate 10 is sintered again for formation of top and bottom surface wirings 18 and 20. Further, since a glass-ceramic material has a low thermal expansion coefficient, the reliability of the mounting part for electronic component 30 such as an integrated circuit (IC) can be improved.

Further, a material used for conductive via 14 and interior wiring layer 16 is not limited so long as it can be co-sintered with a glass-ceramic material and is conductive, namely, silver (Ag), copper (Cu), gold (Au), nickel (Ni), palladium (Pd), silver-palladium alloy, gold-palladium alloy or the like. Further, not only are wiring patterns formed on top and bottom surface wiring layers 18 and 20, but also terminal electrodes (not shown) for mounting the circuit module on a circuit substrate are formed thereon. The terminal electrodes may be gold plated to enhance their soldering qualities.

If, for instance, an IC is used as electronic component 30, cavity 22 is formed larger than the IC's external dimension. Further, on the bottom surface of cavity 22, an electrode pad 24 is formed for connecting with electronic component 30. Ceramic multilayer substrate 10 having cavity 22 may be fabricated by stacking and co-sintering a first green sheet with an opening serving as cavity 22 and a second green sheet with electrode pad 24.

Electronic component 30 is mounted on cavity 22. In this embodiment, since the example of using an IC as electronic component 30 has been illustrated, hereinafter, without further reference, IC 30 indicates electronic component 30. Bump 32 is formed on IC 30, and a general flip-chip mounting technique is used to connect bump 32 with electrode pad 24 formed on the bottom surface of cavity 22. Examples of the flip-chip mounting technique are as follows: a connection technique using a bump electrode and a conductive resin; a connection technique which employs soldering by using a solder bump; a connection technique using a plated bump and a conductive resin; and a connection technique employing an eutectic Au—Sn connection by using gold (Au) as a bump material and depositing tin (Sn) on a surface of electrode pad 24.

Since a gap exists in cavity 22, which has IC 30 mounted thereon, thermosetting resin 40 is used to seal the gap; thereafter, the surface of cavity 22 is planarized to make it approximately coplanar with that of ceramic multilayer substrate 10.

Resin wiring substrate 70 is attached on the surface of ceramic multilayer substrate 10. Resin wiring substrate 70 is composed of sheet 50 formed of first insulating adhesive layer 52 and first wiring layer 54, and stacking sheet 60, which is stacked on sheet 50, formed of second insulating adhesive layer 62 and second wiring layer 64. Ceramic multilayer substrate 10 is attached by first insulating adhesive layer 52 and connected electrically to the terminal electrode, which is a part of top surface wiring layer 18 of ceramic multilayer substrate 10, by conductive resin 56. Further, insulating adhesive layers 52 and 62 function as insulating layers between different layers.

First and second wiring layers 54 and 64 are, for example, formed by etching copper films attached on first and second insulating adhesive layers 52 and 62, respectively. In this case, when each of the copper films is 10 μm or less thick, this allows for higher densification of wiring than that of ceramic multilayer substrate 10 because a wiring width and a wiring pitch may be set to 20-30 µm, respectively.

Further, in this circuit module, electronic component 80 is mounted on a surface of resin wiring substrate 70, which includes an upper region where cavity 22 is formed. Thus electronic component 80 can be mounted on the surface of resin wiring substrate 70, which is located just above where cavity 22 is formed. Such electronic component 80 to be mounted can be a passive device like a chip capacitor or a chip resistor, or another IC different from IC 30. With regard to a method of mounting electronic component 80, a passive device may be connected by a solder reflow connection or a conductive adhesive connection, while an IC may be mounted by a flip-chip mounting technique or a wire bonding technique or the like. For example, when a chip capacitor is used as electronic component 80, it can function as a bypass capacitor connected to IC 30 at the shortest distance, thereby enabling a high-speed operation of IC 30. FIGS. 1A and 1B illustrate an example where a chip capacitor is mounted as electronic component 80. The chip capacitor is connected with second wiring layer 64 of resin wiring substrate 70 by solder 82.

As noted above, the circuit module of the present invention allows for enlarging mountable areas in addition to wiring at a minimum distance between IC 30 mounted on cavity 22 and electronic component 80 mounted on the surface of the resin wiring substrate 70. Accordingly, the circuit module's high-frequency characteristics are enhanced and noises generated by a sudden change of currents are suppressed.

Hereinafter, the method of fabricating a circuit module in accordance with the first embodiment will be described with reference to figures.

Figure 2A:
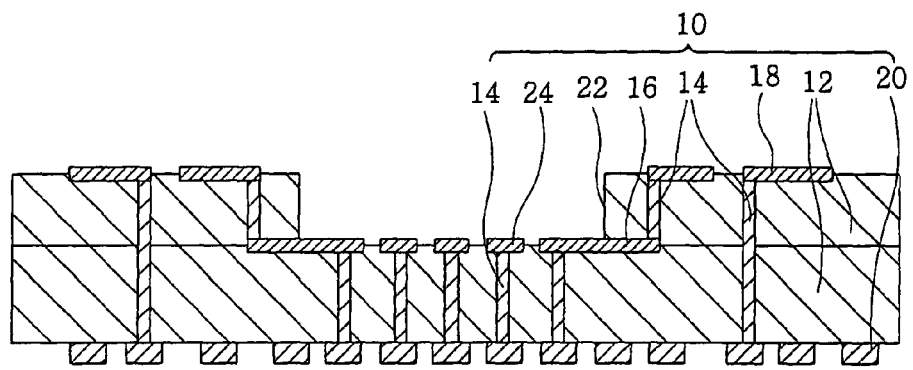
FIGS. 2A to 2C show a method of manufacturing a circuit module in accordance with the first embodiment of this invention, and are cross-sectional views illustrating a step of mounting an IC on a multilayer ceramic substrate and a step of planarizing the ceramic substrate.
Figure 2B:
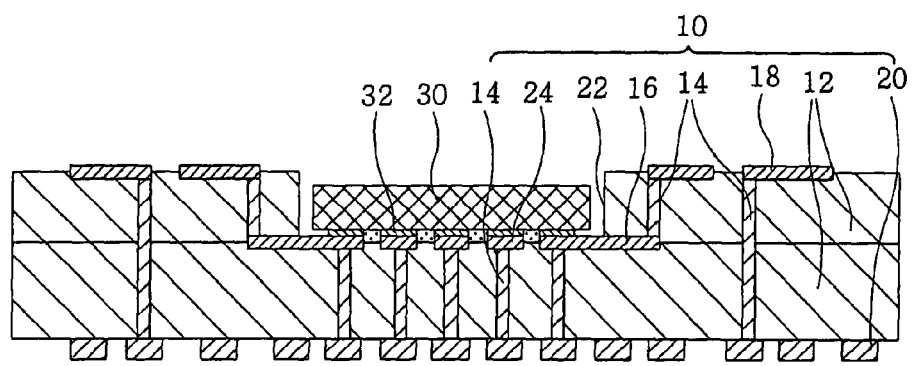
Figure 2C:
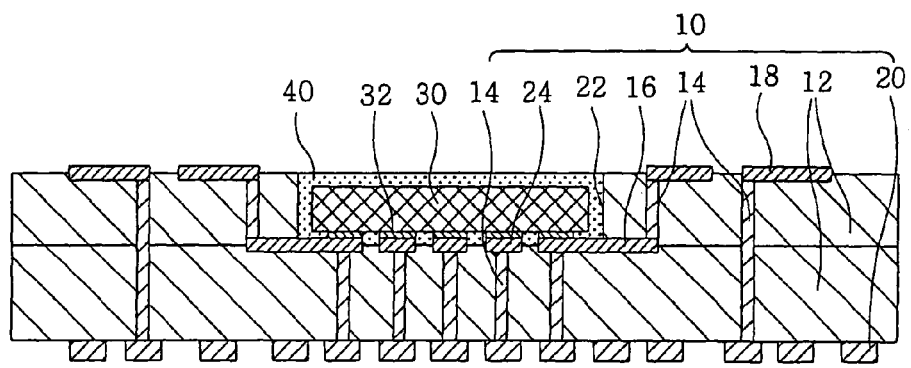

FIGS. 2A to 2C are cross-sectional views illustrating the steps of mounting IC 30 on ceramic multilayer substrate 10 wherein cavity 22 is formed and charging cavity 22 with thermosetting resin 40 for planarization.

As shown in FIG. 2A, a ceramic multi-layer substrate 10 can be easily fabricated by stacking and co-firing a first and a second green sheets prepared as follows: wiring patterns formed of conductive pastes such as silver (Ag) and copper (Cu) are deposited on the first green sheet which has an opening formed by employing processes such as laser technique or punching so that the opening functions as cavity 22 to contain IC 30, while wiring patterns are similarly formed on the second green sheet also.
On the bottom surface of cavity 22, electrode pad 24 is disposed at a position corresponding to bump 32 of IC 30. Subsequently, interior wiring layer 16, top surface wiring layer 18, bottom surface wiring layer 20 and conductive via 14 that interconnect these layers are formed simultaneously.

FIG. 2B is a cross-sectional view illustrating mounting of IC 30 in cavity 22 using a flip-chip mounting technique. As the flip-chip mounting technique, various techniques generally for mounting an IC can be used as discussed earlier.

Next, as shown in FIG. 2C, the gap of cavity 22 is sealed with thermosetting resin 40, and then surface planarization is achieved. The charged quantity of thermosetting resin 40 is controlled so that it corresponds to the difference between cavity 22 and IC 30 volumes. As a result, the level difference between the surface of thermosetting resin 40 filling cavity 22 and the surface of ceramic multilayer substrate 10 can be made less than the thickness of first insulating adhesive layer 52, so that a sufficient adhesive strength is achieved when resin wiring substrate 70 is attached to ceramic multilayer substrate 10. Further, since resin wiring substrate 70 can have an even flat surface after attaching it, the process of forming first wiring layer 54 by etching a metal layer is facilitated. Further, mounting electronic component 80 on resin wiring substrate 70 also becomes easily manageable.

Alternatively, thermosetting resin 40 may be charged more than the aforementioned quantity and thermally cured thereafter, so that a mound of thermosetting resin 40 that formed above the surface of ceramic multilayer substrate 10 be grinded in order to planarize it. Since this method allows for a smaller level difference between the surface of thermosetting resin 40 and that of ceramic multilayer substrate 10, it is possible to enhance adhesive strength and processability, to facilitate the mounting process, and to improve reliability.

Further, thermosetting resin 40 used may be an epoxy resin, a polyimide resin, a silicon resin and the like.

Figure 3A:
FIGS. 3A to 3C are cross-sectional views illustrating a step of manufacturing a sheet in accordance with the manufacturing method of the first embodiment of this invention.
Figure 3B:
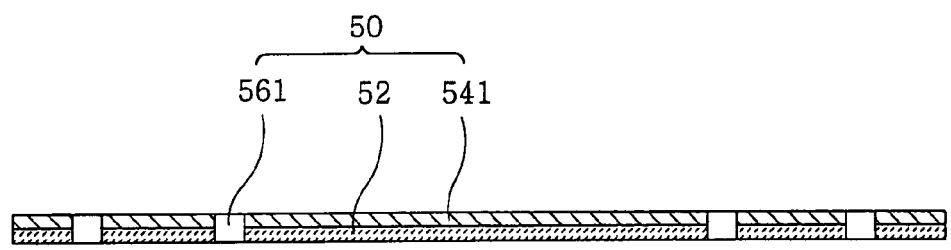
Figure 3C:
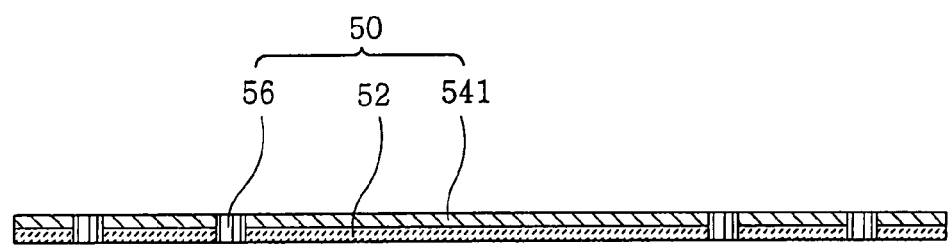

FIGS. 3A to 3C are cross-sectional views illustrating a process of fabricating sheet 50 which functions as a first level resin wiring substrate on ceramic multilayer substrate 10 which is planarized by using thermosetting resin 40.

As shown in FIG. 3A, sheet 50 is fabricated by first attaching insulating adhesive layer 52 to a first metal layer 541 such as copper film. Thereafter, as shown in FIG. 3B, an opening 561 is formed in sheet 50 by drilling or punching of holes or the like.

Next, as shown in FIG. 3C, first opening 561 is filled with a conductive resin 56, whose major component is silver (Ag) or gold (Au), by employing a printing technique or a drawing technique. Following this method, sheet 50 having first opening 561 filled with conductive resin 56 is fabricated. Further, as for first insulating adhesive layer 52, a thermosetting adhesive material such as an epoxy resin, a polyimide resin or a silicon resin is used. This adhesive material shaped into a sheet may be used as first insulating adhesive layer 52, which could be bonded on first metal layer 541, otherwise, a predetermined thickness of the adhesive material can be laminated on first metal layer 541 to be used as first insulating adhesive layer 52.

Subsequently, sheet 50 shown in FIG. 3C is properly aligned on ceramic multilayer substrate 10 shown in FIG. 2C. The aligned sheets are pressurized and heated on its top and bottom major surfaces, whereby first insulating adhesive layer 52 is bonded to ceramic multilayer substrate 10 while top surface wiring layer 18 becomes electrically connected with conductive resin 56. Further, if conductive resin 56 has adhesive characteristics, it can augment the strength of the electrical connection.

Figure 4A:
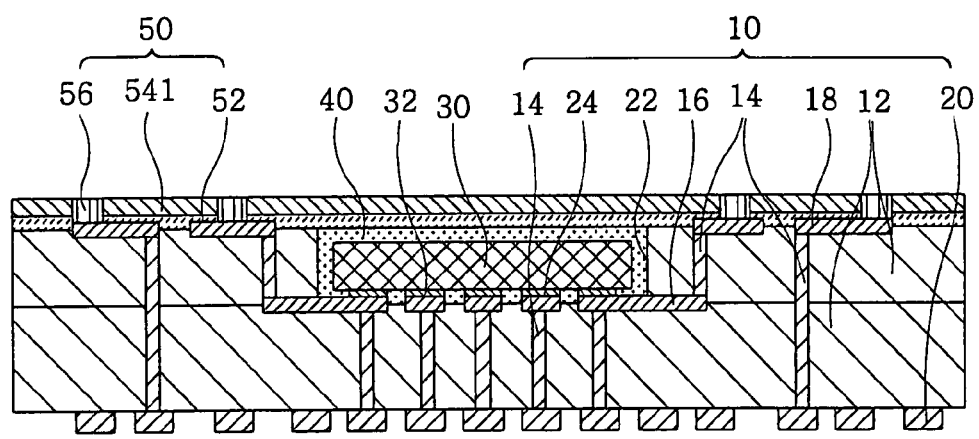
FIGS. 4A and 4B are cross-sectional views illustrating a step of forming a predetermined wiring layer by attaching a sheet on a ceramic multilayer substrate in accordance with the manufacturing method of the first embodiment of this invention.

With respect to the pressurization and heating conditions, using a mold for example, the stacked layers are preliminarily pressurized at about 0.8 kgf/cm$^2$ and heated at about 170° C., and then the heating and pressurizing process is repeated at about 20 kgf/cm$^2$ and about 200° C. under a reduced pressure atmosphere, thereby achieving strong adhesion. The result is shown in FIG. 4A.

Figure 4B:
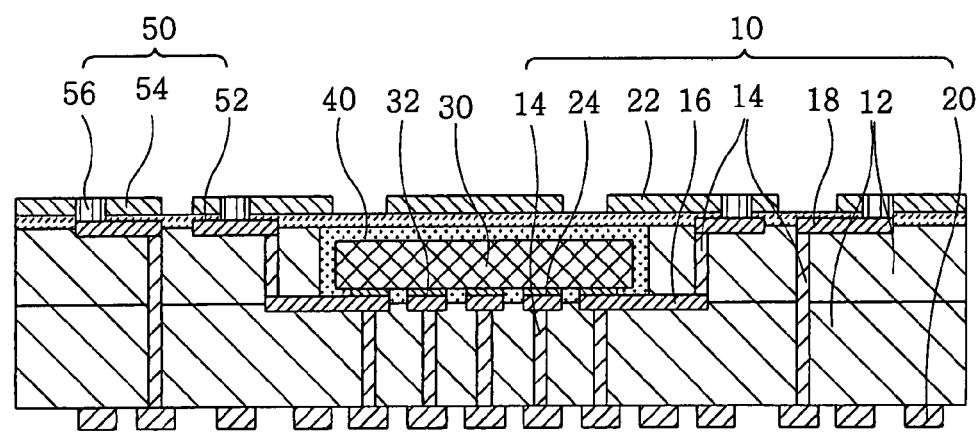

Subsequently, as shown in FIG. 4B, first metal layer 541 of the resin wiring substrate of sheet 50 is etched to remove unnecessary portions to form first wiring layer 54. At this fabrication stage, since sheet 50 functions as a single-layer resin wiring substrate, the assembly in this condition can also be used as a circuit module. Further, upon mounting a passive device such as a capacitor and a resistor, or a functional device such as an IC on first wiring layer 54, the assembly can be used as a high-performance circuit module.

In this embodiment, a method of fabricating a circuit module of a multilayer resin wiring substrate 70 stacked on ceramic multilayer substrate 10 is described.

Figure 5A:
FIGS. 5A to 5C are cross-sectional views illustrating a step of manufacturing a stacking sheet in accordance with the manufacturing method of the first embodiment of this invention.
Figure 5B:
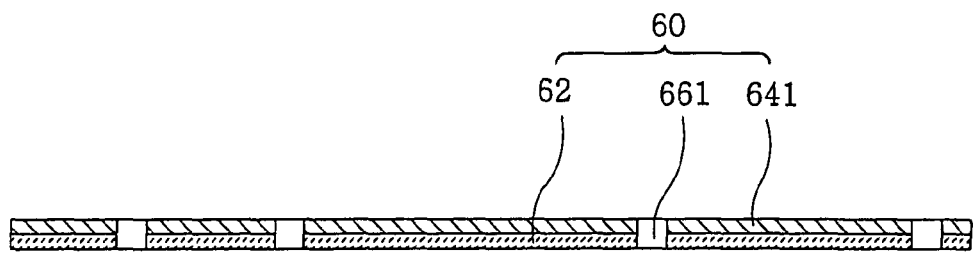
Figure 5C:
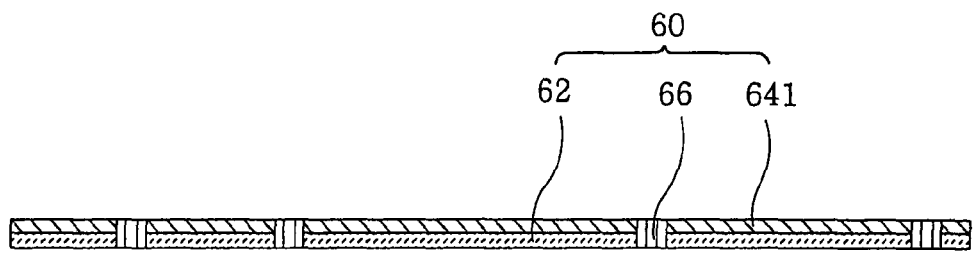

FIGS. 5A to 5C are cross-sectional views illustrating a process of fabricating stacking sheet 60 to be stacked on sheet 50 so as to form a multilayered structure. Stacking sheet 60 is composed of a second metal layer 641 and second insulating adhesive layer 62, and has the same configuration as that of sheet 50 shown in FIGS. 3A to 3C. This is illustrated in FIG. 5A.

Next, second opening 661 is formed at locations where first wiring layer 54 of sheet 50 can establish a connection. Second opening 661 can be formed in the same fashion as first opening 561 of sheet 50. FIG. 5B shows stacking sheet 60 after second opening 661 is formed. Subsequently, second opening 661 is filled with conductive resin 66. This resin charging process can be carried out using the same material and in the same manner as in sheet 50. FIG. 5C shows stacking sheet 60 ready to be bonded to sheet 50 after being charged with conductive resin 66.

Next, after a predetermined position of first wiring layer 54 of sheet 50 is properly aligned with conductive resin 66 of stacking sheet 60, the coupled sheets are subjected to pressurizing and heating for bonding while first wiring layer 54 establishes electrical connection with conductive resin 66 as well. This bonding step is carried out in the same fashion as in the bonding of sheet 50 to ceramic multilayer substrate 10.

Figure 6:
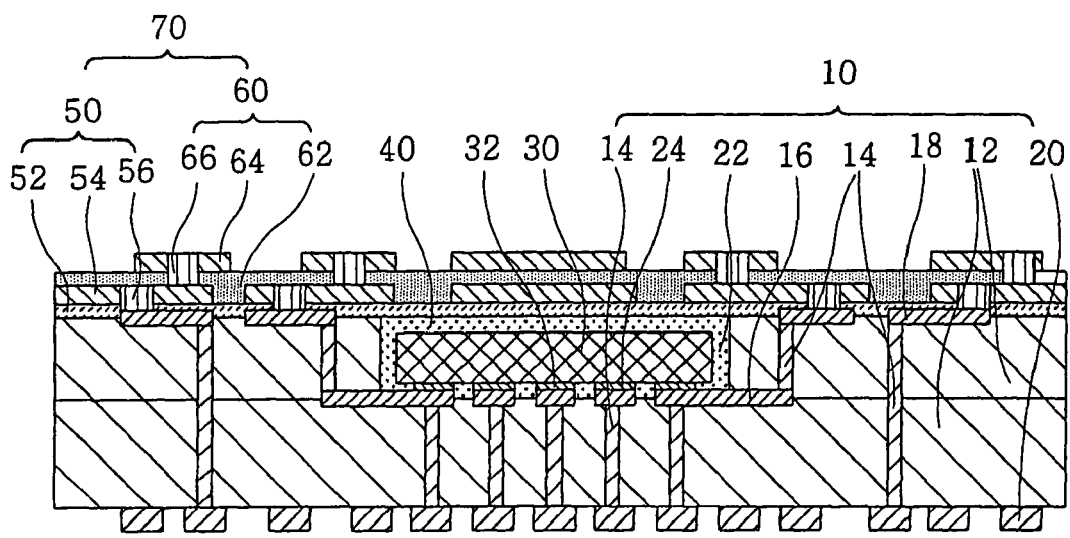
FIG. 6 is a cross-sectional view of a circuit module having a metal layer of a stacking sheet etched to form a multilayer resin wiring substrate in the manufacturing method of the first embodiment of this invention.

Thereafter, second metal layer 641 of stacking sheet 60 is etched to remove unnecessary portions, thereby forming second wiring layer 64 as shown in FIG. 6. On second wiring layer 64 as fabricated thus far, a passive device, for example, capacitor, resistor or inductor, or an IC can be mounted. FIGS. 1A and 1B illustrate a case where a chip capacitor is mounted as electronic component 80.

In accordance with the circuit module of this embodiment, since IC 30 can be mounted on cavity 22 of ceramic multilayer substrate 10, and various electronic components 80 can also be mounted on the surface of resin wiring substrate 70 above cavity 22, not only is it possible to enhance high density mounting capability, but also to achieve, for instance, high speed performance of an IC and to facilitate its correspondence with a high-frequency circuit, because the IC can be connected to a chip capacitor at a minimum distance.

Second Embodiment

Figure 7A:
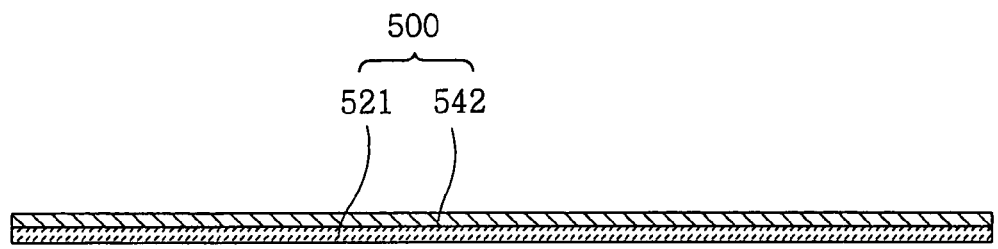
FIGS. 7A to 7C are cross-sectional views illustrating a step of manufacturing a sheet in accordance with a circuit module manufacturing method of the second embodiment of this invention.
Figure 7B:
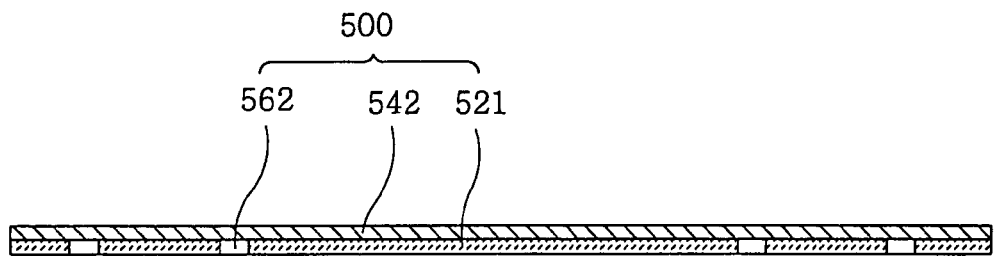
Figure 7C:
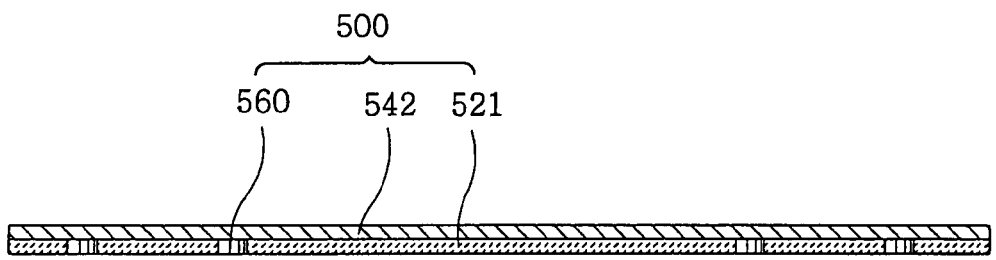
Figure 8A:
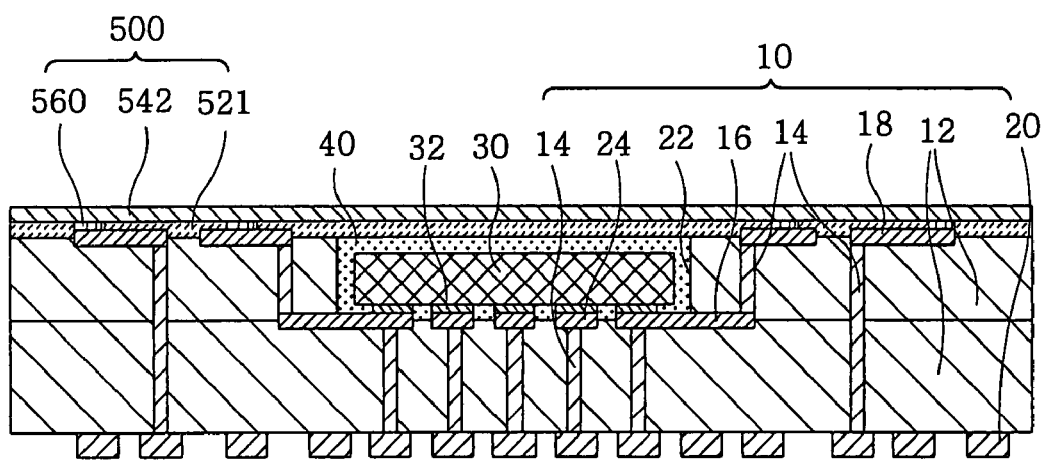
FIGS. 8A and 8B are cross-sectional views illustrating a step of manufacturing a circuit module having a single-layer resin wiring substrate by attaching a sheet on a multilayer ceramic substrate in accordance with the manufacturing method of the second embodiment of this invention.
Figure 8B:
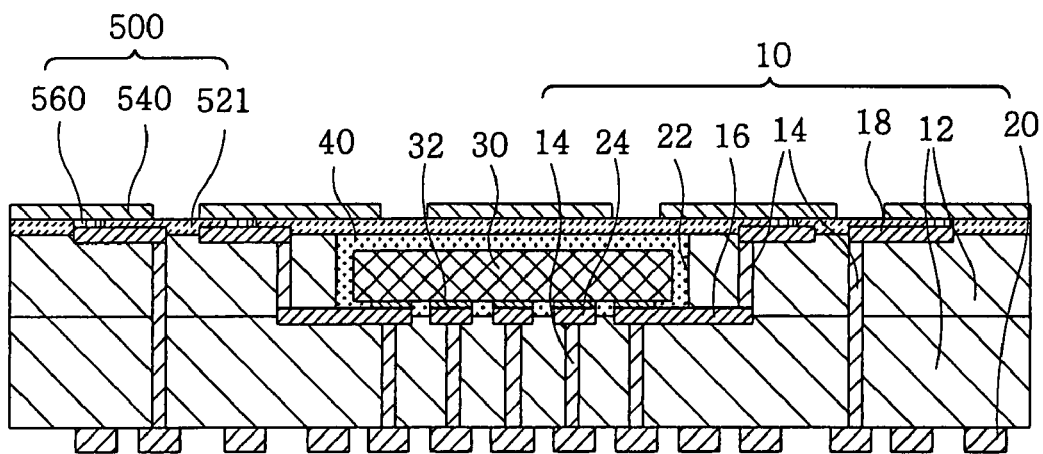

FIGS. 7A to 7C are cross-sectional views illustrating a process of fabricating sheet 500 in the method of fabricating a circuit module in accordance with a second embodiment of the present invention. Further, FIGS. 8A and 8B are cross-sectional views showing a process of stacking sheet 500 on ceramic multilayer substrate 10 wherein IC 30 is mounted on cavity 22 and the substrate is planarized by using thermosetting resin 40, ultimately forming a first wiring layer 540.

The second embodiment is different from the first embodiment with respect to the processes of fabricating sheet 500 and of forming first wiring layer 540 after stacking sheet 500 on ceramic multilayer substrate 10. Hereinafter, a method of fabricating a circuit module is described while focusing on its differences with the first embodiment.

As shown in FIG. 7A, using sheet 500 composed of first metal layer 542 (e.g., copper film) and first insulating adhesive layer 521, first opening 562 is formed at a predetermined location of first insulating adhesive layer 521 as shown in FIG. 7B. First opening 562 serves as a place where it is electrically connected with top surface wiring layer 18 of ceramic multilayer substrate 10, and it is formed by, for example, laser irradiation. The laser by its nature is capable of forming an opening in first insulating adhesive layer 521, but not in first metal layer 542, for example, of copper film because it is highly reflective. Accordingly, laser irradiation allows for perforation of only first insulating adhesive layer 521, not first metal layer 542.

Next, as shown in FIG. 7C, first opening 562 is filled with conductive resin 560 whose main component is silver (Ag) or copper (Cu). With respect to a material of conductive resin 560 and its filling process, their discussion is omitted given that the identical material and process may be used as in the first embodiment.

Sheet 500 fabricated in this manner is properly aligned and then bonded on ceramic multilayer substrate 10, as shown in FIG. 8A. This bonding may be carried out in the same fashion as in the first embodiment.

Further, as shown in FIG. 8B, first metal layer 542 is etched to form first wiring layer 540. As a result, since sheet 500 is capable of functioning as a single-layer resin wiring substrate, it can be used as a circuit module in this form. Further, on a terminal electrode (not shown) disposed in first wiring layer 540 of sheet 500, an electronic component such as a capacitor, a resistor, an inductor or an IC may be mounted.

As noted above, although a resin wiring substrate to be stacked on ceramic multilayer substrate 10 can be a single-layer structure, a method of fabricating a multilayer resin wiring substrate is described in this embodiment.

Figure 9:
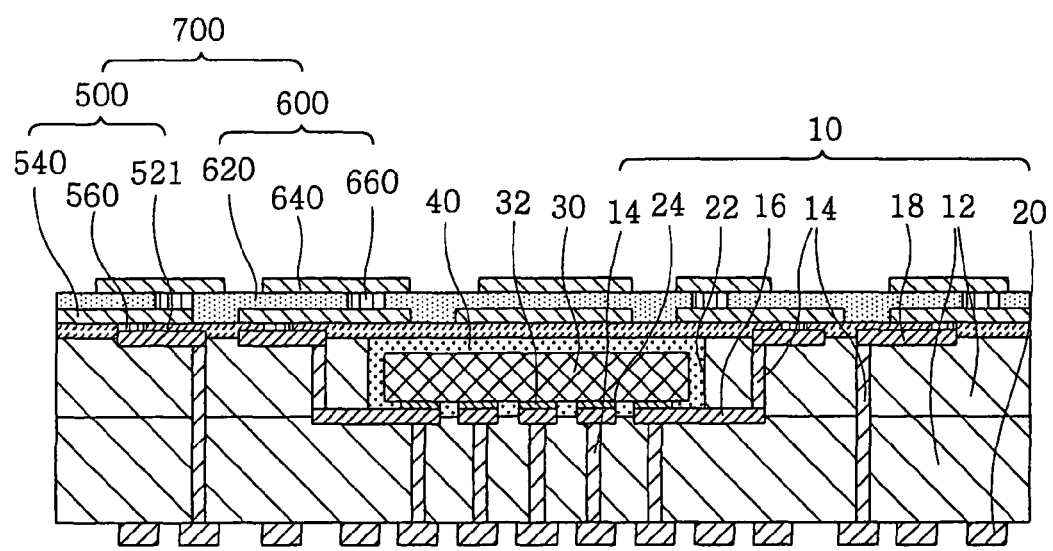
FIG. 9 is a cross-sectional view illustrating a step of manufacturing a circuit module having a multilayer resin wiring substrate by stacking a stacking sheet on top of the other in accordance with the manufacturing method of the second embodiment of this invention.

FIG. 9 is a cross-sectional view of a circuit module formed of a multilayer resin wiring substrate 700 wherein stacking sheet 600 is stacked on sheet 500 shown in FIG. 8B. Stacking sheet 600 may be formed in the same manner using the same material as sheet 500 shown in FIGS. 7A to 7C. Further, given that the process of forming second wiring layer 640 after aligning and bonding stacking sheet 600 on sheet 500 are identical to that of sheet 500, its description is omitted.

Based on the steps described thus far, a circuit module on which multilayer resin wiring substrate 700 is stacked can be made. In this embodiment, since the metal layer is not perforated unlike the first embodiment, laser irradiation can be employed to make fine openings. As a result, multilayer resin wiring substrate 700 becomes capable of even finer micro wiring so that a module with a high density circuit substrate can be made.

Third Embodiment

FIGS. 10A to 10D are cross-sectional views illustrating a process of fabricating sheet 510 in the method of fabricating a circuit module in accordance with a third embodiment of the present invention. Further, FIG. 11 is a cross-sectional view showing a process of stacking sheet 510 having first wiring layer 545 formed thereon, on ceramic multilayer substrate 10 wherein IC 30 is mounted on cavity 22 and the substrate is planarized using thermosetting resin 40.

In this embodiment, with respect to the fabricating step of sheet 510, its difference with that of the first embodiment lies in its stacking step on ceramic multilayer substrate 10 which is carried out after first wiring layer 545 is formed. Hereinafter, a method of fabricating a circuit module is described while focusing on its differences with the first embodiment.

Figure 10A:
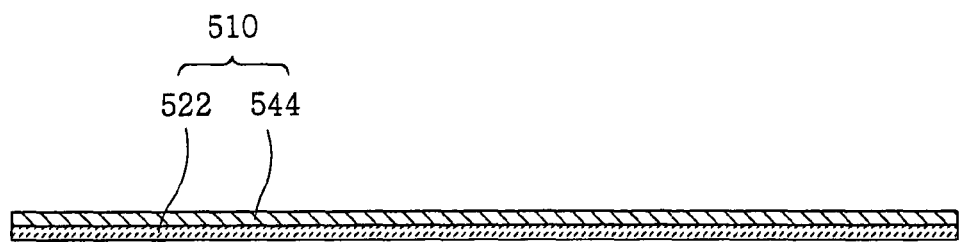
FIGS. 10A to 10D are cross-sectional views illustrating a step of manufacturing a sheet in accordance with a circuit module manufacturing method of the third embodiment of this invention.
Figure 10B:
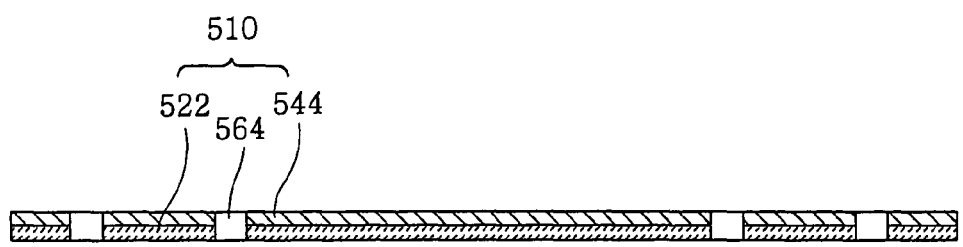
Figure 11:
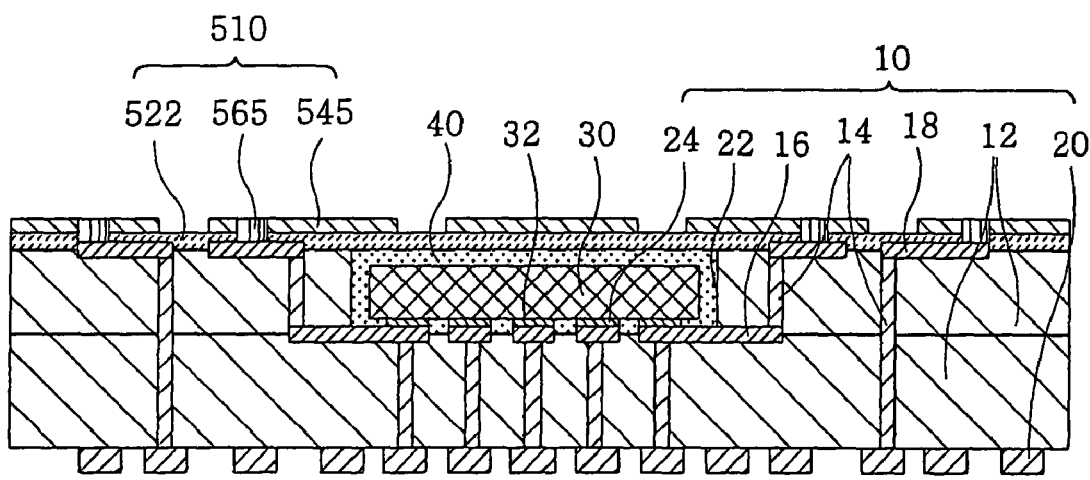
FIG. 11 is a cross-sectional view illustrating a step of manufacturing a circuit module having a single-layer resin wiring substrate by attaching a sheet on a multilayer ceramic substrate in accordance with the manufacturing method of the third embodiment of this invention.

As shown in FIG. 10A, using sheet 510 composed of first metal layer 544 (e.g., copper film) and first insulating adhesive layer 522, first opening 564 is formed at a predetermined location of first insulating adhesive layer 522 and first metal layer 544 as shown in FIG. 10B. First opening 564 is formed by, for example, punching or drilling.

Figure 10C:
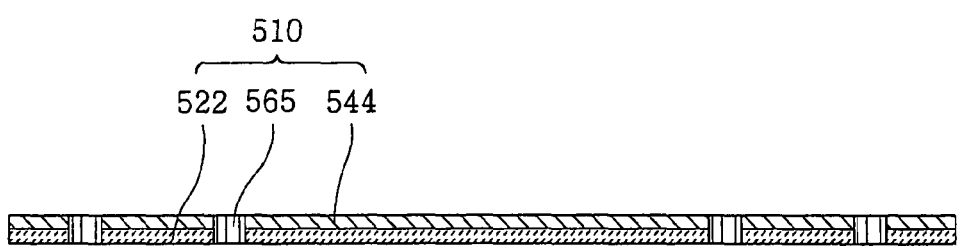

Next, as shown in FIG. 10C, first opening 564 is filled with a conductive resin 565 whose main component is silver (Ag) or copper (Cu). With respect to a material of conductive resin 565 and its filling process, their discussion is omitted given that the identical material and process may be used as in the first embodiment.

Figure 10D:

Next, as shown in FIG. 10D, first wiring layer 545 is formed by processing (e.g., etching) first metal layer 544.

Sheet 510 formed in the manner described thus far is properly aligned and bonded on ceramic multilayer substrate 10 on which IC 30 is mounted as shown in FIG. 11. Since this bonding step can be carried out in the same fashion as the process described in the first embodiment, its description is omitted. As a result, given that sheet 510 is capable of functioning as a single-layer resin wiring substrate, the assembly could be used as a circuit module in this form. Further, on first wiring layer 545, an electronic component such as a capacitor, a resistor, an inductor or an IC may be surface mounted so that the assembly functions as a circuit module.

Figure 12A:
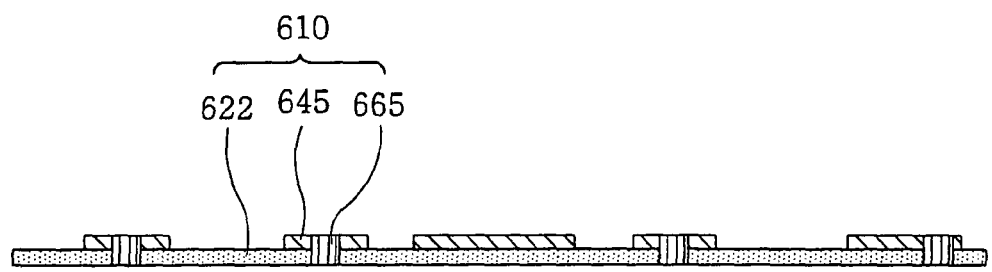
FIGS. 12A and 12B are cross-sectional views illustrating a step of manufacturing a circuit module having a multilayer resin wiring substrate by stacking a stacking sheet on top of the other in accordance with the manufacturing method of the third embodiment of this invention.
Figure 12B:
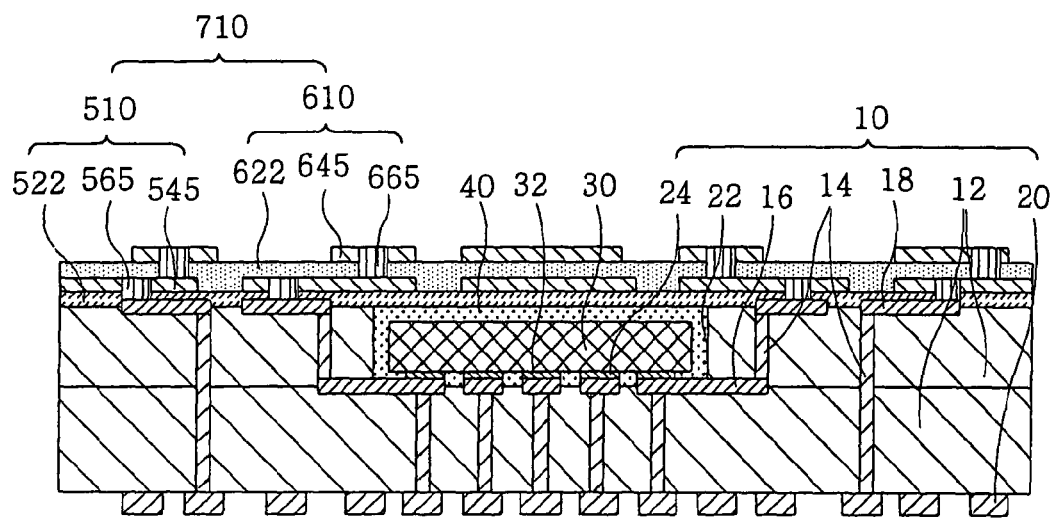

FIGS. 12A and 12B are cross-sectional views illustrating a step of fabricating a circuit module with multilayer resin wiring substrate 710 which is formed of stacking sheet 610 stacked on sheet 510 shown in FIG. 11. Stacking sheet 610 may be fabricated in the same manner using the same material as sheet 510 shown in FIGS. 10A to 10D. Specifically, as shown in FIG. 12A, stacking sheet 610 is fabricated by forming second wiring layer 645 from etching a metal layer on second insulating adhesive layer 622 while a second opening is filled with conductive resin 665.

As shown in FIG. 12B, stacking sheet 610 on which second wiring layer 645 is formed is properly aligned and bonded on sheet 510 while first wiring layer 545 of sheet 510 becomes electrically connected to conductive resin 665 simultaneously. An electronic component such as a capacitor as shown in FIGS. 1A and 1B can be mounted on second wiring layer 645 of the circuit module.

With respect to the method of fabricating a circuit module in accordance with the third embodiment, before sheet 510 and stacking sheet 610 are bonded on ceramic multilayer substrate 10, they are first subjected to charging first and second openings with conductive resins 565 and 665, and to forming first and second wiring layers 545 and 645. Thus, a circuit module is fabricated simply when the sheets are bonded on ceramic multilayer substrate 10. Therefore, sheet 510 and stacking sheet 610 may be fabricated in a large area collectively, thereafter formed for each ceramic multilayer substrate 10 and bonded thereon. In this fashion, fabricating steps can be considerably simplified.

Further, on second wiring layer 645, an electronic component which can be mounted is not limited to a capacitor, rather, it can be a passive device such as a resistor or an inductor, otherwise, a functional device such as a memory, an IC, or an image sensor, depending on the function of a fabricated circuit module.

Fourth Embodiment

Hereinafter, a method of fabricating a circuit module in accordance with a fourth embodiment is described with reference to FIGS. 13A to 14B.

Figure 13A:
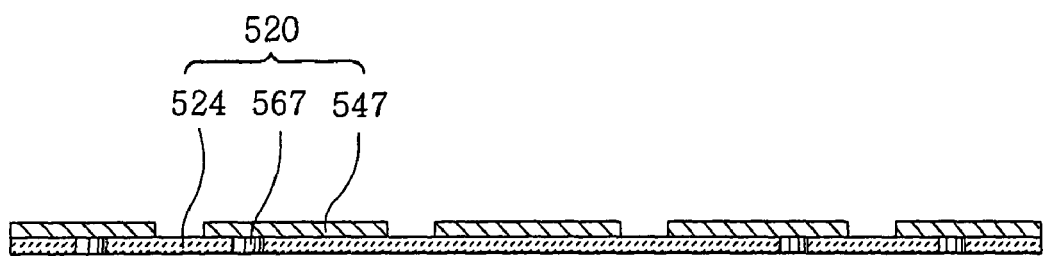
FIGS. 13A and 13B are cross-sectional views illustrating a step of manufacturing a circuit module having a single-layer resin wiring substrate by attaching a sheet on a multilayer ceramic substrate in accordance with the manufacturing method of the fourth embodiment of this invention.
Figure 13B:
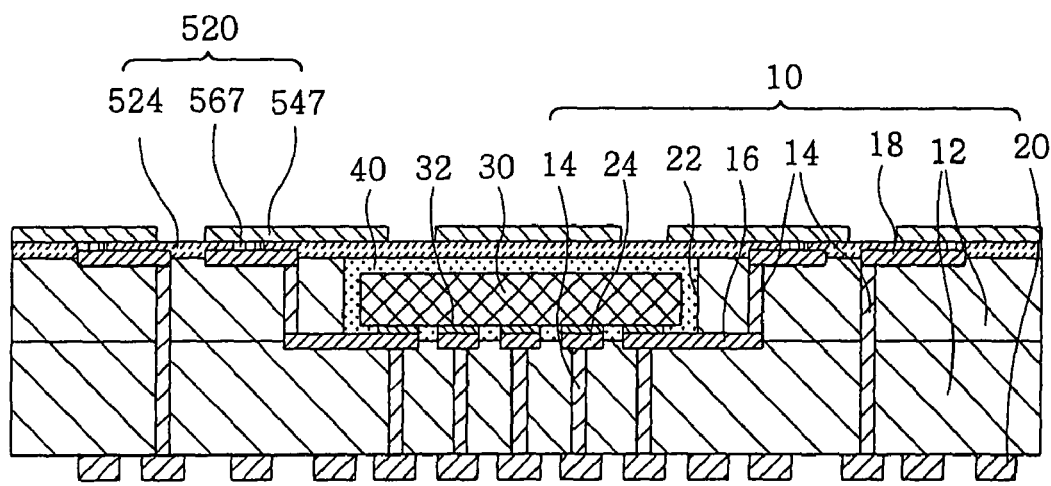

FIG. 13A is a cross-sectional view of sheet 520, and FIG. 13B is a cross-sectional view of the sheet bonded on ceramic multilayer substrate 10 on which IC 30 is mounted. In this embodiment, sheet 520 is composed of a metal layer (e.g., copper film) formed on first insulating adhesive layer 524 and, before being bonded on ceramic multilayer substrate 10, the metal layer is treated to form first wiring layer 547 by employing a process such as etching. Further, sheet 520 is provided with a first opening only extending through first insulating adhesive layer 524 and the hole is filled with conductive resin 567. Since the steps of forming the first opening and filling it with conductive resin 567 may be carried out in the same fashion as those of the second embodiment, their description is omitted.

Sheet 520 fabricated in the manner above is properly aligned and bonded on ceramic multilayer substrate 10 as shown in FIG. 13B while an electrical connection between top surface wiring layer 18 and conductive resin 567 is established simultaneously. Since this process can be carried out in the same manner as that of the second embodiment, its description is omitted. As a result of boding sheet 520, a circuit module having a single-layer resin wiring substrate can be obtained. While the single-layer resin wiring substrate can be used as a part of the circuit module, it can also be used after an electronic component such as a capacitor, a resistor, an inductor or an IC is surface mounted on first wiring layer 547.

Figure 14A:
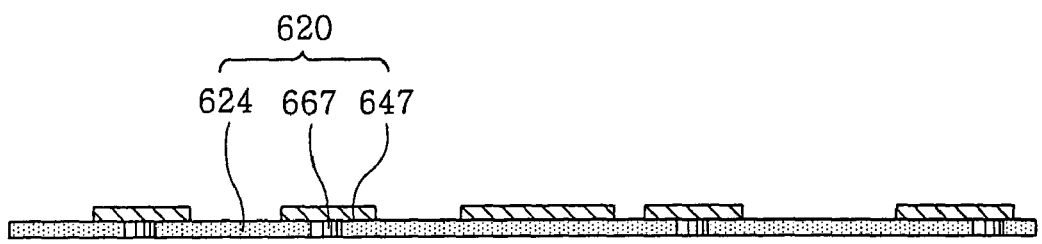
FIGS. 14A and 14B are cross-sectional views illustrating a step of manufacturing a circuit module having a multilayer resin wiring substrate by stacking a stacking sheet on top of the other in accordance with the manufacturing method of the fourth embodiment of this invention.
Figure 14B:
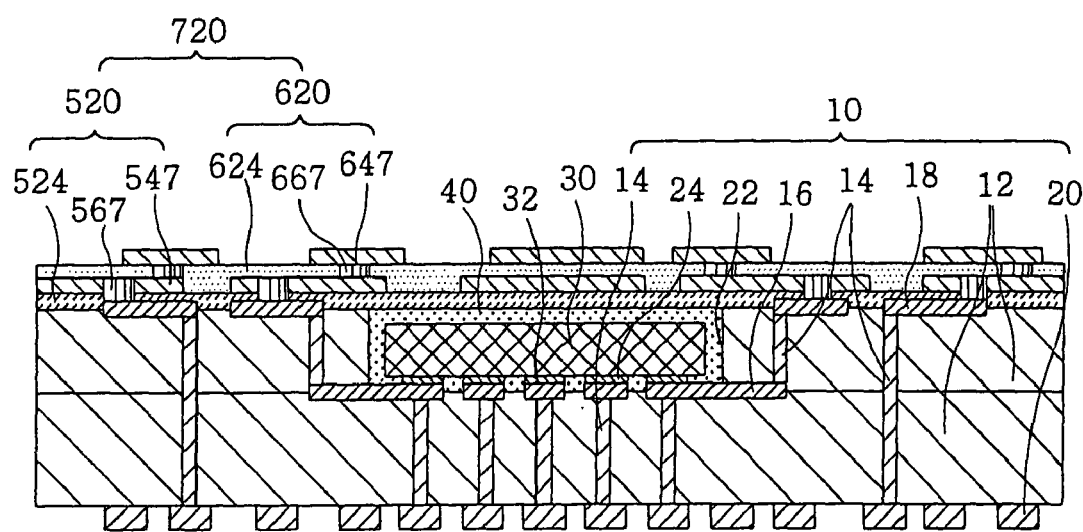

In the fourth embodiment, the method of stacking a multilayer resin wiring substrate on a ceramic multilayer substrate is also described. FIGS. 14A and 14B show a method of fabricating a circuit module having multilayer resin wiring substrate 720 formed of stacking sheet 620, which is stacked on sheet 520 shown in FIG. 13B. Stacking sheet 620 is composed of a second metal layer formed on second insulating adhesive layer 624. The second metal layer is treated to form second wiring layer 647 by employing a process such as etching. Further, second insulating adhesive layer 624 is provided with a second opening at a predetermined place and the opening is filled with conductive resin 667. Stacking sheet 620 can be fabricated in the same manner as sheet 520.

As shown in FIG. 14B, stacking sheet 620 fabricated in this manner is bonded after properly aligning its conductive resin 667 with first wiring layer 547 of sheet 520 on ceramic multilayer substrate 10 while first wiring layer 547 becomes electrically connected to conductive resin 667 simultaneously. Since this process can be carried out in the same fashion as the bonding process of sheet 520, its description is omitted. As a result of bonding stacking sheet 620, a circuit module having multilayer resin wiring substrate 720 can be obtained. While the stacking sheet can be used as a part of the circuit module, it can also be used after an electronic component such as a capacitor, a resistor, an inductor or an IC is surface mounted on second wiring layer 647.

Fifth Embodiment

A method of fabricating a circuit module in accordance with a fifth embodiment of the present invention will be described with reference to FIGS. 15A to 16B. As can be seen from FIGS. 15A to 15C, the method of circuit module fabrication of this embodiment is characterized by fabricating first wiring layer 548, and then forming a first opening 568 which extends through first wiring layer 548 and first insulating adhesive layer 526 and subsequently bonding sheet 530 on ceramic multilayer substrate 10 on which IC 30 is mounted, and finally, filling first opening 568 with conductive resin 569.

Figure 15A:
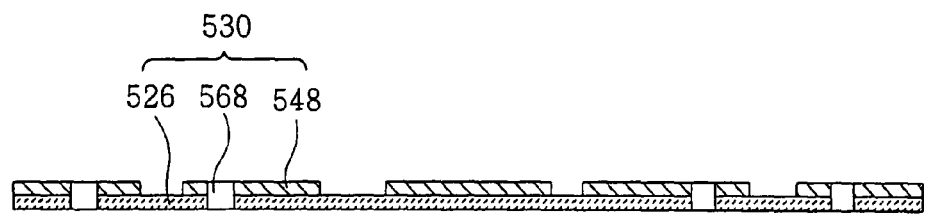
FIGS. 15A to 15C are cross-sectional views illustrating a step of manufacturing a circuit module having a single-layer resin wiring substrate by attaching a sheet on a multilayer ceramic substrate in accordance with the manufacturing method of the fifth embodiment of this invention.
Figure 15B:
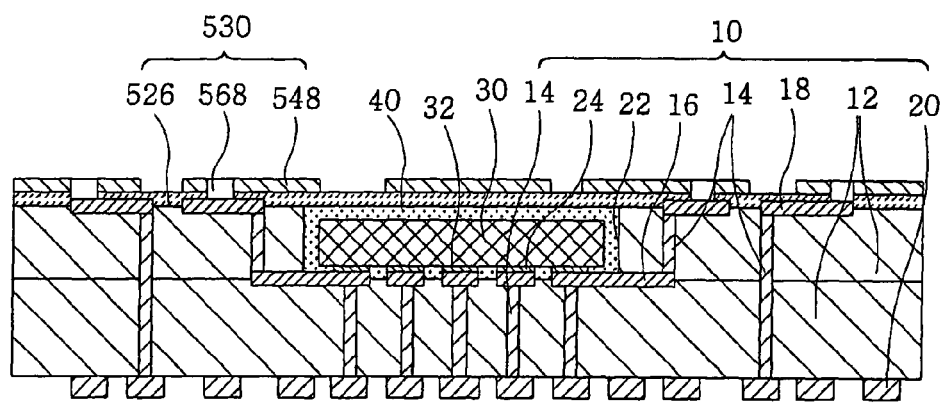
Figure 15C:
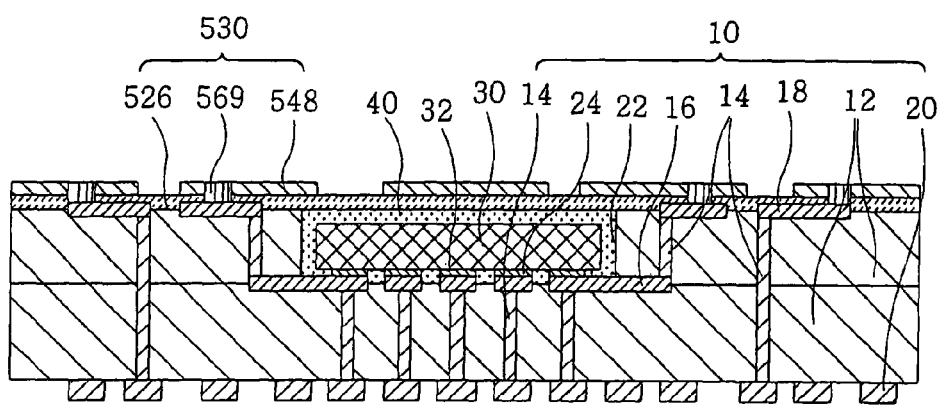

FIGS. 15A to 15C are cross-sectional views illustrating a method of fabricating a circuit module having a single layer resin wiring substrate. As shown in FIG. 15A, sheet 530 used is composed of a first metal layer formed of, for example, a copper film, and first insulating adhesive layer 526 while first wiring layer 548 is formed by employing a process such as etching, on the first metal layer. Further, first wiring layer 548 is provided at a predetermined place with first opening 568 which extends through first insulating adhesive layer 526. This process can be carried out in the same manner as in the first embodiment.

FIG. 15B is a cross-sectional view illustrating sheet 530 bonded on ceramic multilayer substrate 10 on which IC 30 is mounted. This bonding process can also be carried out in the same fashion as in the first embodiment.

Thereafter, as shown in FIG. 15C, first opening 568 is filled with conductive resin 569 so that top surface wiring layer 18 of ceramic multilayer substrate 10 can establish electrical connection with first wiring layer 548 of sheet 530, thereby obtaining a circuit module having a single layer resin wiring substrate. While the single-layer resin wiring substrate can be used as a part of the circuit module, it can also be used after an electronic component such as a capacitor, a resistor, an inductor or an IC is surface mounted on second wiring layer 548.

In this embodiment, a method of stacking a multilayer resin wiring substrate on a ceramic multilayer substrate is also described.

Figure 16A:
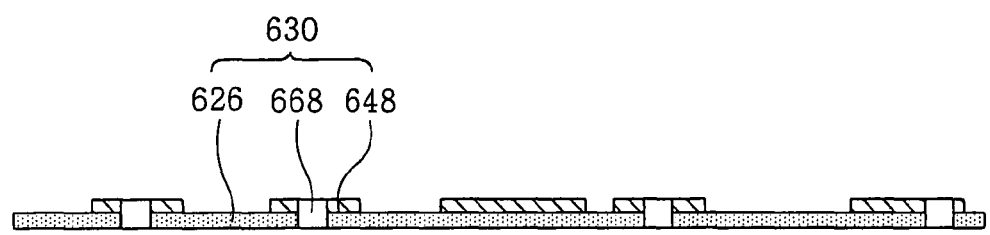
FIGS. 16A and 16B are cross-sectional views illustrating a step of manufacturing a circuit module having a multilayer resin wiring substrate by stacking a stacking sheet on top of the other in accordance with the manufacturing method of the fifth embodiment of this invention.
Figure 16B:
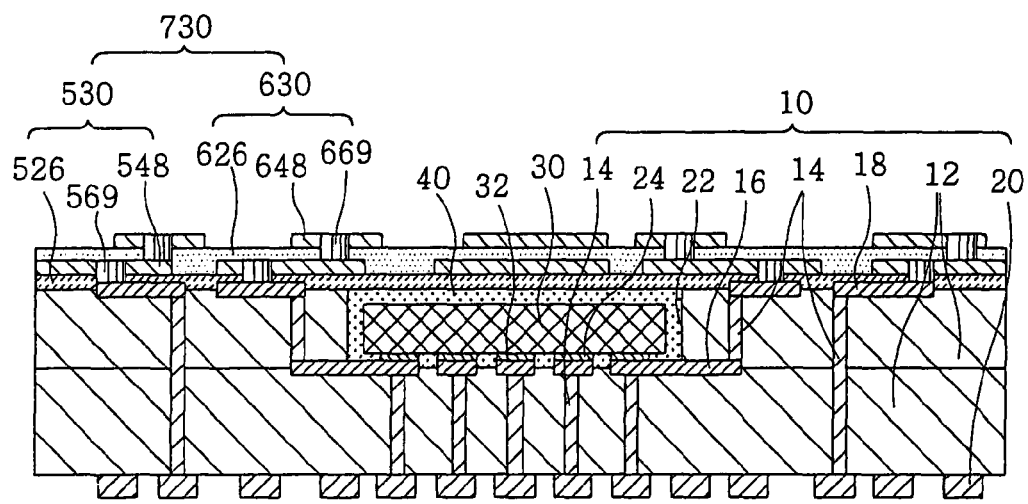

FIGS. 16A and 16B are cross-sectional views illustrating a method of fabricating a circuit module having multilayer resin wiring substrate 730 composed of sheet 530 on which stacking sheet 630 is stacked. As shown in FIG. 16A, stacking sheet 630 is fabricated in the same manner as sheet 530. Specifically, using stacking sheet 630 composed of a second metal layer formed of, for example, a copper film and second insulating adhesive layer 626, the second metal layer is subjected to a process such as etching to form second wiring layer 648. Further, second wiring layer 648 is provided with second opening 668 extending through second insulating adhesive layer 626 at a predetermined place. This process carried out in the same fashion as in the first embodiment.

Thereafter, as shown in FIG. 16B, first wiring layer 548 of sheet 530 is bonded to second opening 668 of stacking sheet 630 after they are properly aligned, and then second opening 668 is filled with a conductive resin 669 so that first wiring layer 548 of sheet 530 establishes electrical connection with second wiring layer 648 of stacking sheet 630 by the conductive resin 669, thereby obtaining a circuit module having a multilayer resin wiring substrate 730. While the multilayer resin wiring substrate can be used as a part of the circuit module, it can also be used as a circuit module having an electronic component such as a capacitor, a resistor, an inductor or an IC is surface mounted on second wiring layer 648.

In this fabricating method, an opening may be formed not only by a mechanical method such as drilling and punching, but also by various other methods. For example, a predetermined place of a metal layer is removed by etching, thereby having the opening only extending through the metal layer, which is then bonded on a ceramic multilayer substrate. After bonding, laser irradiation is used to perforate the insulating adhesive layer so that the opening extends through the lower layer. After forming the opening, it can be filled with a conductive resin. Since a wiring layer is not etched when an insulating adhesive layer is perforated by laser irradiation, it is possible to process in accordance with the same configuration of openings in the wiring layer in a self-alignment manner so as to make the precision of the laser irradiation rough.

Further, although the first to fifth embodiments illustrate cases where only one IC is mounted on a cavity, the present invention is not limited thereto. For example, an IC can be mounted together with a passive device; otherwise, multiple ICs may be mounted as well. In addition, there can be more than one cavity.

Further, although these embodiments described thus far cases where a resin wiring substrate has either a single-layer or double-layer structure, the present invention is not limited thereto. Even if a resin wiring substrate has a multilayer structure, the same process is employed to fabricate such a module. Moreover, with respect to a ceramic multilayer substrate, this invention is not limited to the method of bonding two green sheets. For instance, three or more green sheets can be bonded to each other so that they can be used as a ceramic multilayer substrate.

With a circuit module and method of fabricating same in accordance with the present invention, since an electronic component such as IC is mounted on a cavity of a ceramic multilayer substrate while the cavity is planarized by using a thermosetting resin before stacking a resin wiring substrate, it is possible to form a wiring and to mount a electronic component on the cavity, the capabilities not available in the prior art. Consequently, the mounting density of electronic components is enhanced and the connection between an IC and a chip capacitor can be established at a minimum distance. Therefore, it is possible not only to operate the IC at a high speed but also to obtain a circuit module compatible with a high frequency. Further, when electronic components including an IC are mounted, it is possible to diversify application of the circuit module.

While the invention has been shown and described with respect to the preferred embodiments, it will be understood by those skilled in the art that various changes and modifications may be made without departing from the spirit and scope of the invention as defined in the following claims.

What is claimed is:

1. A method of fabricating a circuit module, comprising the steps of:
   (a) mounting at least one electronic component in a cavity provided in a ceramic multilayer substrate;
   (b) filling a space between the electronic component and the cavity with a thermosetting resin to planarize a surface of the filled cavity;
   (c) providing at least one opening in an insulating adhesive layer of a sheet having the insulating adhesive layer and a metal layer stacked on each other or in both of the insulating adhesive layer and the metal layer, and filling the opening with a conductive resin connected to the metal layer;
   (d) bonding the sheet and the ceramic multilayer substrate by the insulating adhesive layer and at the same time electrically connecting a wiring layer formed on the ceramic multilayer substrate with the conductive resin; and
   (e) patterning the metal layer of the sheet to form a wiring layer,
   wherein the step (b) of filling the space to planarize the surface of the filled cavity is carried out by first filling the cavity with the thermosetting resin by using an amount exceeding the difference between a volume of the cavity and that of the electronic component, thermally curing the filled thermosetting resin, and then polishing a surface of the cured thermosetting resin and wherein the height difference between a surface of the polished resin and that of the ceramic multilayer substrate around the cavity is less than a thickness of the insulating adhesive layer directly abutting the ceramic multilayer substrate.

2. The method of claim 1, further comprising, after the step (e), the steps of:
   (f) bonding a stacking sheet which has an insulating adhesive layer and a metal layer, at least one opening being provided in the insulating adhesive layer or in both of the insulating adhesive layer and the metal layer and filled with a conductive resin connected with the metal layer, by means of the insulating adhesive layer, onto an uppermost layer of an assembly provided in the immediately preceding step and at the same time electrically connecting the wiring layer formed on the uppermost layer with the conductive resin of the stacking sheet; and (g) patterning the metal layer of the stacking sheet to form a wiring layer, wherein the steps (f) and (g) are repeated N times (N being an integer not smaller than 1).

3. The method of claim 1, wherein the electronic component includes a semiconductor integrated circuit device.

4. A method of fabricating a circuit module, comprising the steps of:

(a) mounting at least one electronic component in a cavity provided in a ceramic multilayer substrate;

(b) filling a space between the electronic component and the cavity with a thermosetting resin to planarize a surface of the filled cavity;

(c) patterning a metal layer of a sheet to form a wiring layer, the sheet having an insulating adhesive layer and the metal layer stacked on each other;

(d) providing at least one opening in the insulating adhesive layer or in both of the insulating adhesive layer and the wiring layer, and filling the opening with a conductive resin connected to the wiring layer; and (e) bonding the sheet and the ceramic multilayer substrate by means of the insulating adhesive layer and at the same time electrically connecting a wiring layer formed on the ceramic multilayer substrate with the conductive resin, wherein the step (b) of filling the space to planarize the surface of the filled cavity is carried out by first filling the cavity with the thermosetting resin by using an amount exceeding the difference between a volume of the cavity and that of the electronic component, thermally curing the filled thermosetting resin, and then polishing a surface of the cured thermosetting resin and wherein the height difference between a surface of the polished resin and that of the ceramic multilayer substrate around the cavity is less than a thickness of the insulating adhesive layer directly abutting the ceramic multilayer substrate.

5. The method of claim 4, further comprising, after the step (e), the step of:

(f) bonding a stacking sheet which has an insulating adhesive layer and a wiring layer, at least one opening being provided in the insulating adhesive layer or in both of the insulating adhesive layer and the wiring layer and filled with a conductive resin connected with the wiring layer, by means of the insulating adhesive layer, onto an uppermost layer of an assembly provided in the immediately preceding step and at the same time electrically connecting the wiring layer formed on the uppermost layer with the conductive resin of the stacking sheet, wherein the step (f) is repeated N times (N being an integer not smaller than 1).

6. The method of claim 4, wherein the electronic component includes a semiconductor integrated circuit device.

7. A method of fabricating a circuit module, comprising the steps of:

(a) mounting at least one electronic component in a cavity provided in a ceramic multilayer substrate;

(b) filling a space between the electronic component and the cavity with a thermosetting resin to planarize a surface of the filled cavity;

(c) patterning a metal layer of a sheet to form a wiring layer and simultaneously providing at least one opening in the wiring layer, the sheet having an insulating adhesive layer and the metal layer stacked on each other;

(d) bonding the sheet and the ceramic multilayer substrate by means of the insulating adhesive layer;

(e) removing the insulating adhesive layer located under the opening in the wiring layer to provide an extended opening exposing therethrough a surface of a wiring layer formed on the ceramic multilayer substrate; and (f) filling the extended opening with a conductive resin to electrically connect the wiring layer of the sheet with the wiring layer on the ceramic multilayer substrate, wherein the step (b) of filling the space to planarize the surface of the filled cavity is carried out by first filling the cavity with the thermosetting resin by using an amount exceeding the difference between a volume of the cavity and that of the electronic component, thermally curing the filled thermosetting resin, and then polishing a surface of the cured thermosetting resin and wherein the height difference between a surface of the polished resin and that of the ceramic multilayer substrate around the cavity is less than a thickness of the insulating adhesive layer directly abutting the ceramic multilayer substrate.

8. The method of claim 7, further comprising, after the step (f), the steps of:

(g) bonding a stacking sheet which has an insulating adhesive layer and a wiring layer, at least one opening being provided in the wiring layer, onto an uppermost layer of an assembly provided in the immediately preceding step by means of the insulating adhesive layer;

(h), in the stacking sheet, removing the insulating adhesive layer located under the opening in the wiring layer to provide an extended opening exposing therethrough a surface of the uppermost layer; and (i) filling the extended opening in the stacking sheet with a conductive resin and electrically connecting the wiring layer of the stacking sheet with a wiring layer of the uppermost layer, wherein the steps (g) to (i) are repeated N times (N being an integer not smaller than 1).

9. The method of claim 7, wherein the electronic component includes a semiconductor integrated circuit device.

* * * * *